United States Patent [19]
Ishii

[11] Patent Number: 5,239,701
[45] Date of Patent: Aug. 24, 1993

[54] RADIO RECEIVER WITH IMPROVED CHANNEL SELECTION AND RECEPTION

[75] Inventor: Hisao Ishii, Ashikaga, Japan

[73] Assignee: Sanyo Electric Co., Ltd., Osaka, Japan

[21] Appl. No.: 612,527

[22] Filed: Nov. 13, 1990

[30] Foreign Application Priority Data

Nov. 15, 1989 [JP] Japan .................................. 1-296931
Nov. 15, 1989 [JP] Japan .................................. 1-296932
Nov. 16, 1989 [JP] Japan .................................. 1-298344

[51] Int. Cl.⁵ .................................................. H04B 1/26
[52] U.S. Cl. ............................. 455/180.1; 455/182.2; 455/182.3; 455/184.1; 455/187.1; 455/200.1; 455/247.1; 455/266
[58] Field of Search ............... 455/150, 161, 164, 165, 455/179, 180, 182–185, 187, 188, 192, 194, 195, 200, 247, 266, 303, 324, 152.1, 150.1, 161.2, 164.2, 165.1, 179.1, 180.1, 182.2, 182.1, 182.3, 183.2, 186.1, 185.1, 187.1, 188.1, 192.2, 192.3, 195.1, 200.1, 247.1, 182.2, ; 358/191.1, 193.1

[56] References Cited

U.S. PATENT DOCUMENTS 4,575,761  3/1986  Carlson et al. .................. 358/191.1
4,654,884  3/1987  Sakai et al. ........................ 455/183
4,987,606  1/1991  Ozeki et al. ....................... 455/188

Primary Examiner—Reinhard J. Eisenzopf
Assistant Examiner—Chi Pham
Attorney, Agent, or Firm—Darby & Darby

[57] ABSTRACT

A radio receiver responsive to a received RF signal containing a plurality of channel frequencies each having broadcast information which includes a circuit for producing a wide band version of the received RF signal and a circuit for producing a narrow band version of the received RF signal. Selection of a channel at a given frequency is accomplished by using the wide band version of the received RF signal and after such selection is made, the narrow band version of the signal is used for further reception of the selected channel frequency and reproduction of the information thereon.

13 Claims, 4 Drawing Sheets

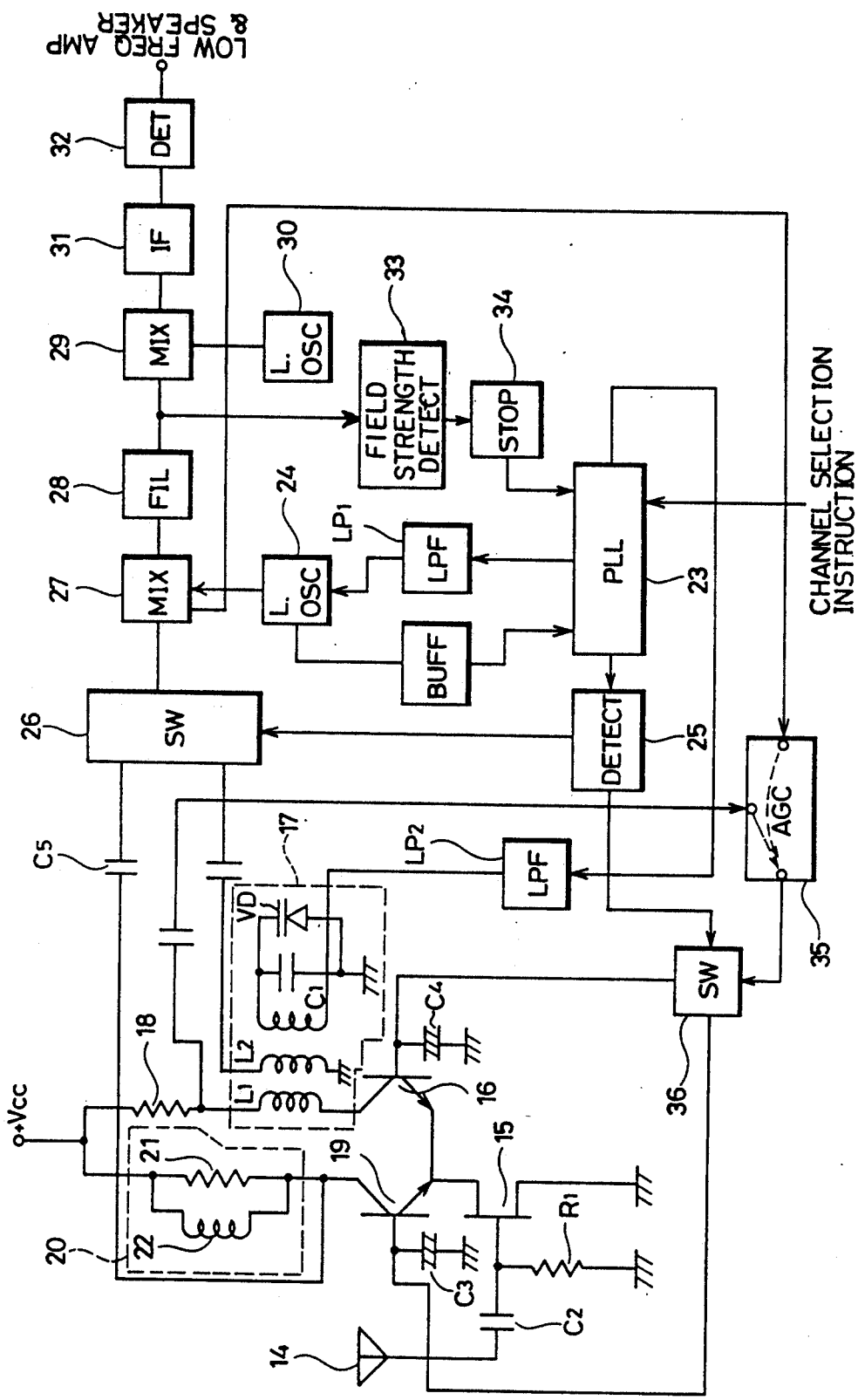

RADIO RECEIVER WITH IMPROVED CHANNEL SELECTION AND RECEPTION

BACKGROUND OF THE INVENTION

1. Field of the Invention

The present invention relates generally to radio receivers, and in particular, to a circuit arrangement for amplifying incoming radio frequency (RF) signals through an antenna. More particularly, the present invention relates to an improvement in quality of a reception signal of an AM radio receiver having an automatic channel selecting function.

2. Description of the Background Art

An AM radio receiver is well known which receives an AM (amplitude modulated) broadcasting radio wave (RF signal) transmitted from a broadcast station. One example thereof is described in '88 *Sanyo Semiconductor Data Book*, "Section: Bipolar Integrated Circuit for Car Audio", P73. The circuit arrangement of such AM radio receiver is shown in FIG. 1.

With reference to FIG. 1, the AM radio receiver includes an RF amplifying circuit 5 for amplifying an incoming RF signal from an antenna 1 and an RF tuning circuit 6 for extracting an RF signal having a desired channel frequency from the RF signal amplified by RF amplifying circuit 5.

RF amplifying circuit 5 includes an antenna damping circuit 2 for attenuating an incoming RF signal from the antenna 1, an FET (field effect transistor) 3 for amplifying the attenuated RF signal and an AGC (automatic gain control) transistor 4 for adjusting a gain of the RF signal amplified by FET 3 and transmitting the adjusted signal. AGC transistor 4 comprises an npn bipolar transistor. The amplification gain of which is controlled by a gain controlling signal applied to its base.

RF tuning circuit 6 comprises an LC resonance circuit including a coil, a capacitor and a variable capacitance diode. The resonance frequency of this LC resonance circuit can be changed by varying the capacitance of the variable capacitance diode in response to a tuning frequency controlling signal voltage VT. RF tuning circuit 6 outputs an RF signal having a narrow band tuned to a desired channel frequency.

The radio receiver shown in FIG. 1 further includes a mixing circuit 8 for mixing the tuned (narrow band) RF signal from RF tuning circuit 6 with a local oscillating frequency signal from an local oscillating circuit 7 to generate an intermediate frequency (IF) signal, an IF amplifying circuit 9 for amplifying the IF signal from mixing circuit 8, and a detecting circuit 10 for AM detecting the amplified IF signal from IF amplifying circuit 9 to output a low frequency signal.

A superheterodyne system including such a frequency conversion allows an amplification at two different frequencies (RF amplification and IF amplification), leading to a stable amplification and high sensitivity. The frequency of the IF signal is fixed (for example 450 Khz) to be lower than that of the reception (desired) RF signal, improving a selectivity.

The difference between the frequency of the oscillating signal and the tuned frequency of RF tuning circuit 6 should be fixed. RF tuning circuit 6 therefore receives the same (or corresponding) control signal VT as the control signal VT applied to oscillating circuit 6, and the tuned frequency varies in response to the oscillating frequency.

A tracking adjustment is carried out for fixing the difference between the tuned frequency F1 of the RF tuning circuit 6 and the oscillating signal frequency F2 of the local oscillating circuit 7. It is difficult to hold a difference constant between the tuned frequency f1 and the local oscillating frequency f2 in all the reception frequency bands.

Hence, in an ordinary AM radio receiver, adjustment is made such that a tracking error becomes zero at specific tracking points (for example at 600 KHz and 1400 KHz) in the reception frequency band (for example from 522 KHz to 1629 KHz).

As a result, a conventional AM radio receiver allows the gain of RF amplifying circuit 5 to decrease due to inaccurate AGC control (the signal VAGC varies with an IF signal level) and selectivity to be deteriorated due to a variation of the IF signal frequency.

An AM stereo receiver further allows a separation to be deteriorated. In an automatic channel selection, a channel selection is carried out based on an IF signal level, whereby the sensitivity for channel selection stopping varies.

Tracking error is minimized in a reception frequency range but it is large of frequencies a band in outside of the tracking points, that is, in 522-620 KHz and 1400-1629 KHz.

In order to eliminate such deviation of the tuning frequency of RF tuning circuit 6, proposed is a non-tuning system AM radio shown in FIG. 2.

In FIG. 2, the AM radio receiver includes an RL parallel circuit 60 which generates a non-tuning RF signal (referred to as a wide band RF signal) from the RF signal amplified by RF amplifying circuit 5, and which parallel circuit constitutes an output load of AGC transistor 4.

The resistor of RL parallel circuit 60 is set to have a relatively large value allowing a sufficiently large signal change to be transmitted to subsequent stage. The radio receiver further includes a first mixing circuit 8 for mixing the wide band RF signal with a first local oscillating signal from a local oscillating circuit 7 to generate a first IF signal of 10.7 MHz, and a second mixing circuit 11 for mixing the first IF signal with a second local oscillating signal from a second local oscillating circuit 12 to generate a second IF signal of 450 KHz.

First local oscillating circuit 7 generates the first local oscillating signal in response to an oscillating signal from an oscillating circuit 70. Oscillating circuit 70 changes an oscillating frequency in response to a control signal VT.

Second local oscillating circuit 12 generates the second local oscillating signal in response to a fixed oscillating signal from a crystal oscillator 12'.

The second IF signal from second mixing circuit 12 is applied to an IF amplifying circuit 9.

The radio receiver of FIG. 2 employs a double conversion system generating first and second IF signals to enhance its selectivity, and no RF tuning circuit is required. Therefore, no tracking error occurs.

In addition, the first IF signal frequency is set as high as 10.7 MHz to significantly reduce image interference.

However, in the radio receiver of FIG. 2, with no RF tuning circuit provided, all the signals including an interference signal within the reception wave band are applied to first mixing circuit 8, thereby significantly deteriorating an interference signal characteristic, in particular, a cross modulation interference characteristic.

FIG. 3 shows a possible arrangement allowing an elimination of tracking error and an improvement in a cross modulation interference characteristic.

In FIG. 3, an RF tuning circuit 6 is provided as a collector output load of an AGC transistor 4 and a resistor 13 is provided between RF tuning circuit 6 and a power supply +Vcc.

Tuning circuit 6 outputs a narrow band RF signal tuned with a desired frequency. Resistor 13 produces a wide band RF signal.

In an automatic channel selection, a channel selection is carried out by using a wide band RF signal. After the channel selection, a reception is made by using a narrow band RF signal.

With this arrangement, the channel selection is carried out by a wide band RF signal to cause no tracking error. A narrow band RF signal is employed in a tuned reception state other than an automatic channel selection to improve a cross modulation interference characteristic.

The arrangement shown in FIG. 3, however, has the following problems to be solved.

In order to extract a wide band RF signal and transmit the extracted wide band RF signal to downstream circuitry at a signal level at which the downstream circuitry does not malfunction, resistor 13 should have a relatively large resistance value, for example, 2kΩ.

When a strong field interference signal, particularly a signal of a shortwave band (2 MHz–30 MHz) outside the band of RF tuning circuit 6 is received, however, high resistance 13 detects the reception of the interference signal to cause a large signal change at the primary coil of RF tuning circuit 6, which change is transmitted to the secondary coil of RF tuning circuit 6. In other words, the isolation of RF tuning circuit 6 is deteriorated to leak the signal from high resistance 13 to RF tuning circuit 6. The output of RF tuning circuit 6 is applied to the first mixing circuit generating a first IF signal of 10.7 MHz. Consequently, the signal leaked from resistor 13 is superimposed on the first IF signal to cause beat frequency interference.

SUMMARY OF THE INVENTION

An object of the present invention is to provide a tracking error-free and cross modulation interference free high performance radio receiver and an RF amplifying circuit therefor.

Another object of the present invention is to provide a radio receiver allowing an automatic and precise selection of a desired frequency.

A further object of the present invention is to provide a high performance AM radio receiver allowing a high speed automatic channel selection.

The RF amplifying circuit according to the present invention includes an amplifying element for amplifying an incoming RF signal through an antenna, a first AGC element coupled to the output of the amplifying element and a second AGC element coupled to the output of the amplifying element to operate differentially from the first AGC element. Each of the first and the second AGC elements adjusts a gain of an output of the amplifying element in response to a gain control signal.

The RF amplifying circuit further includes an RF tuning circuit provided as an output load of the first AGC element, a first resistance element provided as the output load of the second AGC element and a second resistance element series-connected to the RF tuning circuit. The RF tuning circuit outputs a narrow band RF signal. The first resistance element outputs a wide band RF signal.

The RF amplifying circuit further includes a first control circuit responsive to an instruction of a channel selection for setting the second AGC element in an ON state to transmit the wide band RF signal to downstream circuitry, and a second control circuit responsive to the completion of the channel selection for setting a tuning frequency of the RF tuning circuit to a selected channel frequency and setting the first AGC element in an ON state to transmit the narrow band RF signal to the downstream circuitry.

The radio receiver according to the present invention has functions of a channel selection by using a wide band RF signal in response to an instruction of an automatic channel selection, a fine adjustment of a selected channel frequency after the channel selection, and a reception at the frequency after the fine adjustment by using a narrow band RF signal. The radio receiver includes an RF tuning circuit for generating a narrow band RF signal, a filter for transmitting a tuning frequency controlling signal to the RF tuning circuit and a switching circuit for switching a time constant of the filter at the fine adjustment and at the reception.

With the above-described arrangement, the wide band RF signal and the narrow band RF signal are complementarily generated in different paths, which prevents cross modulation interference.

The channel selection using a narrow band RF signal eliminates tracking error.

Furthermore, a switching of a time constant of the filter transmitting the tuning frequency controlling signal to the RF tuning circuit reduces a time period required for fine tuning and improves SN ratio.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows an arrangement of a radio receiver according to one embodiment of the present invention.

DESCRIPTION OF THE PREFERRED EMBODIMENTS

Figure 1:
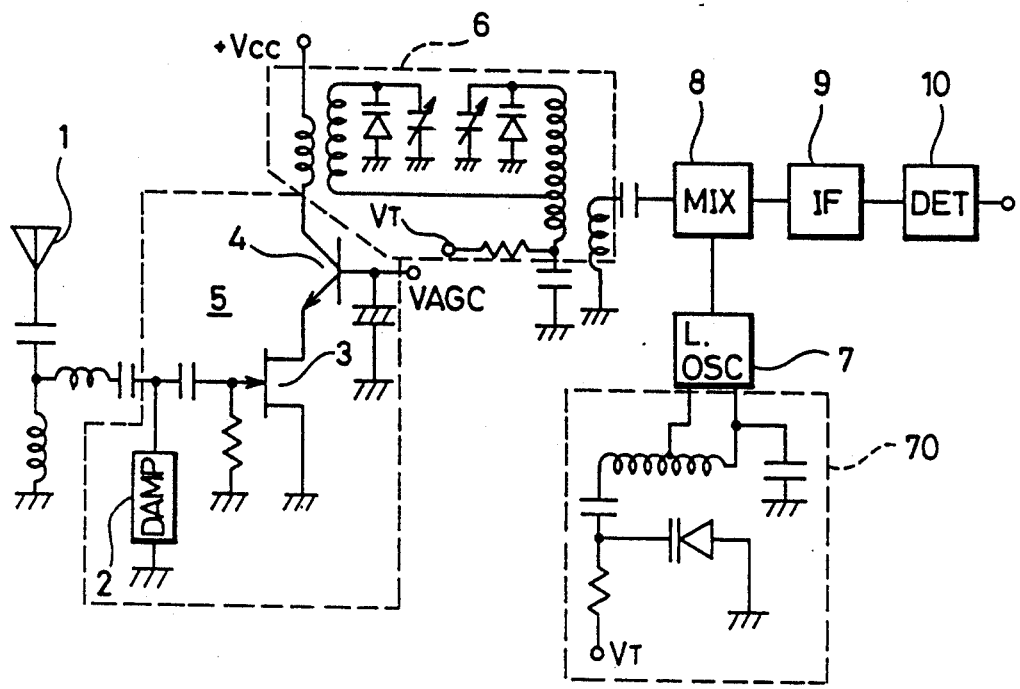
FIG. 1 shows an arrangement of a conventional AM radio receiver.
Figure 2:
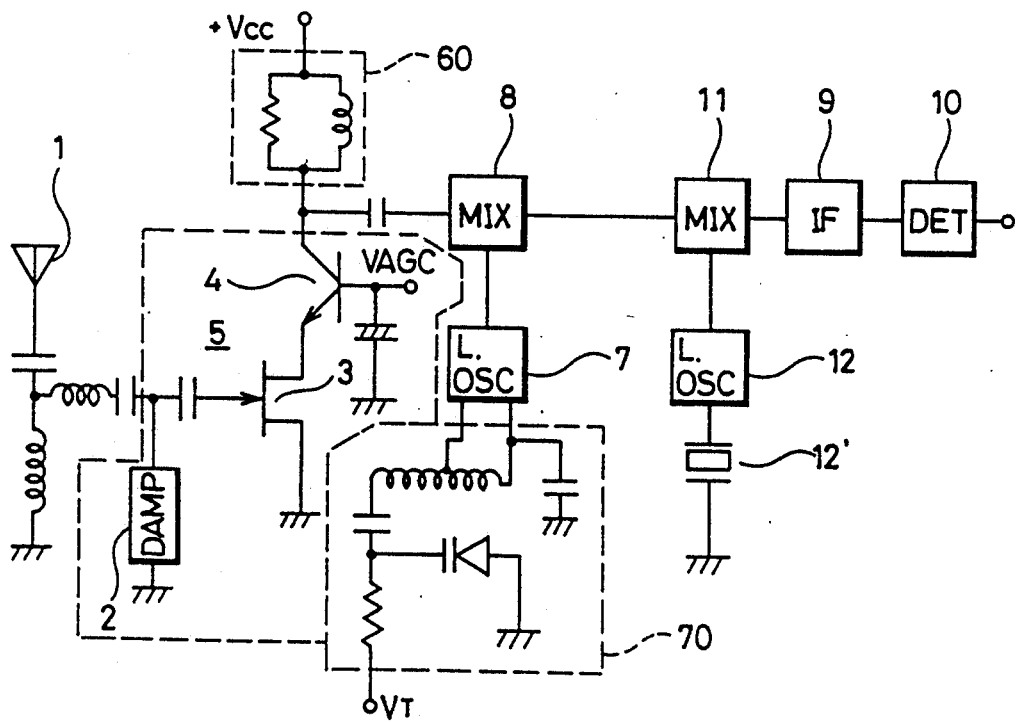
FIG. 2 shows an arrangement of another conventional AM radio receiver.
Figure 3:
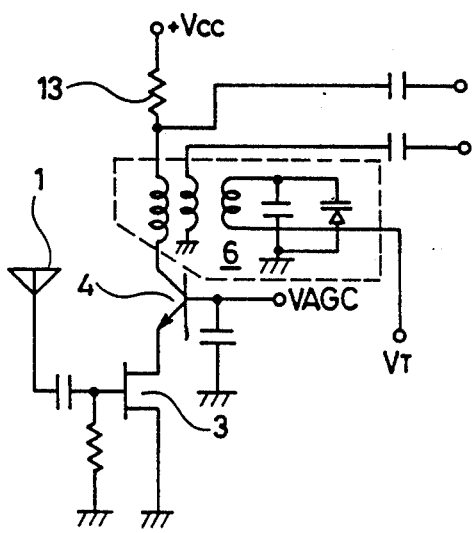
FIG. 3 shows a possible arrangement of an RF amplifying circuit to be improved according to the present invention.

FIG. 4 is a diagram showing the arrangement of the main part of the radio receiver according to one embodiment of the present invention. Referring to FIG. 4, we will describe in the following the arrangement and the operation of the radio receiver according to such one embodiment of the present invention.

In FIG. 4, the radio frequency signal amplifying circuit (hereinafter referred to as RF amplifying circuit) comprises an FET (field effect transistor) 15 for amplifying an RF signal received through antenna 14, a first AGC transistor 16 and a second AGC transistor 19 each for adjusting the gain of the RF signal amplified by FET 15, a tuning circuit 17 for obtaining a desired signal from the collector output of first AGC transistor 16, an RL parallel circuit 20 as a collector load of second AGC transistor 19 and a resistor 18 connected between tuning circuit 17 and a power supply +Vcc.

First AGC transistor 16 and second AGC transistor 19 differentially or complementarily operate under the control of a switching circuit 36. More specifically, switching circuit 36 applies an AGC signal from an AGC (automatic gain control) signal generating circuit 35 to either base of first AGC transistor 16 or of second AGC transistor 19 in response to a control signal from a channel selection stop detecting circuit 25 which will be described later. While one of the AGC transistors performs an AGC operation in response to an AGC signal, the other AGC transistor is turned off. AGC signal generating circuit 35, channel selection stop detecting circuit 25 and switching circuit 36 will be described later.

Tuning circuit 17 includes a primary coil L1, connected to the collector of first AGC transistor 16, a secondary coil L2 inductance-coupled to primary coil L1 and a capacitor C1 and a variable capacitance diode VD each connected in parallel with coil L2.

RL parallel circuit 20 includes a resistor 21 and a coil 22 of large inductance connected in parallel with each other. RL parallel circuit 20 produces from second AGC transistor 19 an RF signal amplified by FET 15 without band limitation.

The resistance value of resistor 21 is set to a relatively large value, for example, 2KΩ in order to cause a large signal change. The resistance value of resistor 18 is set to a relatively small value, for example, 30Ω. The reason for the small resistance value is that a small change amount is sufficient because the signal change amount is amplified by AGC signal generating circuit 35 and an adverse effect to tuning circuit 17 should be prevented.

The radio receiver shown in FIG. 4 further comprises a selection circuit 26 for passing either the collector output (non-tuning signal) of second AGC transistor 19 or the output (tuning signal) of secondary coil L2 of tuning circuit 17, a first mixing circuit 27 for mixing the output signal of selection circuit 26 with an oscillating signal from a first local oscillating circuit 24 to generate a first intermediate frequency (IF) signal, a second mixing circuit 29 for mixing the first IF signal with a second oscillating signal from a second local oscillating circuit 30, and a detection circuit 32 for AM detecting of the second IF signal to generate a low frequency signal including a desired signal component.

The first IF signal is set to a frequency of 10.7 Mhz and a frequency of the second IF signal is set to 450 KHz.

Provided between first mixing circuit 27 and second mixing circuit 29 is an IF filter 28 for passing the first IF signal to remove an undesired signal component therein. Provided between second mixing circuit 29 and detection circuit 32 is an IF amplifying circuit (intermediate frequency amplifying circuit) 31 for amplifying the second IF signal and including an IF tuning circuit. The desired signal detected by detection circuit 32 is applied through a low frequency amplifying circuit (not shown) to a speaker (not shown) wherein the signal is reproduced.

The radio receiver further comprises, for channel selection and reception, a PLL (phase locked loop) circuit 23 for controlling the oscillating frequency of first local oscillating circuit 24, a field strength detecting circuit 33 for detecting a field strength of the first IF signal from first IF filer 28, a stopping circuit 34 for generating a channel selection stopping signal in response to a field strength detecting signal from field strength detecting circuit 33 and an automatic channel selection state detecting circuit 25 for controlling channel selecting operations of switching circuit 36 and selecting circuit 26 in accordance with a channel selection operation state of PLL circuit 23.

PLL circuit 23 outputs an oscillating frequency control signal through a first low pass filter LP1 to first local oscillating circuit 24 and a tuning frequency control signal through a second low pass filter LP2 to tuning circuit 17.

AGC control signal generating circuit 35 generates an AGC signal in response to the RF signal generated from one end of resistor 18 and the RF signal from a front or input stage of first mixing circuit 27. Referring to FIG. 4, we will describe operations of this radio receiver.

Pressing an automatic channel selection switch button (not shown) for an automatic channel selection generates an instruction of automatic channel selection which is applied to PLL circuit 23. PLL circuit 23 enters an automatic channel selection state in response to the instruction of automatic channel selection to start selecting a channel. More specifically, the oscillating frequency control signal from PLL circuit 23 changes, so that an oscillating frequency of first mixing circuit 24 sequentially changes in accordance with an interchannel step. An interchannel step is an interval between frequencies allotted to a broadcast station. In a Japanese medium wave broadcasting, a frequency region of 531-1602 KHz in the frequency range of 526.5-1606.5 KHz is used for the broadcast stations at an interval of 9 KHz. A channel selecting operation using PLL circuit 23 as a frequency synthesizer is commonly known and therefore no detailed description thereof will be made here.

When PLL circuit 23 enters an automatic channel selection state, which is detected by automatic channel selection state detecting circuit 25. This detection is carried out by detecting an instruction for changing an oscillating frequency control signal in PLL circuit 23, for example.

When automatic channel selection state detecting circuit 25 detects that PLL circuit 23 is in an automatic channel selection state, the circuit 25 sets switching circuit 36 in a first state, thereby applying the AGC signal from AGC signal generating circuit 35 to second AGC transistor 19.

Meanwhile, the RF signal received at antenna 14 is applied to the gate of FET15 through a coupling capacitor C2. A resistor R1 is an antenna input damping element which prevents cross modulation due to an excess input voltage. FET 15 amplifies the RF signal applied to the gate and transmits the amplified RF signal to the emitters of first and second AGC transistors 16 and 19.

Now, second AGC transistor 19 is turned on with the AGC signal received at its base through switching circuit 36. At the same time, first AGC transistor 16 is turned off. Second AGC transistor 19 has a gain controlled in response to a charge potential at a capacitor C3, that is, the AGC signal level, thereby changing the current amount flowing therethrough. The current through second AGC transistor 19 is converted into a voltage by RL parallel circuit 20, which voltage is transmitted to one input of selection circuit 26 through a coupling capacitor C5.

Automatic channel selection state detecting circuit 25, on detecting PLL circuit 23 being in an automatic channel selection state, generates a control signal to pass the first wide band RF signal from second AGC transistor 19 to selection circuit 26. As a result, the first wide band RF signal is transmitted to first mixing circuit 27.

First mixing circuit 27 mixes this first wide band RF signal with the oscillating signal from first local oscillating circuit 24 to output a first IF signal of 10.7 Mhz. The first IF signal is transmitted to second mixing circuit 30 through first IF filter 28. Second mixing circuit 30 mixes the first IF signal whose noise component is removed by first IF filter 29 with the oscillating signal from second local oscillating circuit 30 to generate a second IF signal having a frequency of 450 KHz. The second IF signal is amplified by IF amplifying circuit 31 and then applied to detection circuit 32. Detection circuit 32 detects this second IF signal. This detected signal is amplified by a low frequency amplifying circuit and then applied to a speaker wherein the signal is reproduced.

Field strength detecting circuit 33 monitors the output level of first IF filter 28, and provides a signal indicating the level of the first IF signal to the stopping circuit 34.

Stopping circuit 34 compares the field strength indicating signal from this field strength detecting circuit 33 with a predetermined reference voltage. When the field strength indicated by the field strength indicating signal exceeds this reference voltage, stopping circuit 34 makes the determination that a certain station is selected to generate a stop signal and applies the same to PLL circuit 23.

In response to this stop signal, PLL circuit 23 fixes the control signal level. As a result, the radio receiver enters into tuning state. When no stop signal is generated, PLL circuit 23 continues a channel selecting operation to change the control signal level and applies it to first local oscillating circuit 24 in order to receive broadcasting from another broadcast station.

In response to stopping of the automatic channel selecting operation in PLL circuit 23, automatic channel selection state detecting circuit 25 sets switching circuit 36 in a second state and also makes switching of the selection circuit 26. As a result, the AGC signal from AGC signal generating circuit 35 is applied to the base of first AGC transistor 16 while RF signal from tuning circuit 17 is applied to mixing circuit 27.

The tuning frequency of the tuning circuit 17 is determined by the inductance of secondary coil L2 and each capacitance value of capacitor C1 and the variable capacitance diode VD, resulting in a narrow signal band. The tuning RF signal of the tuning circuit 17 is referred to as a narrow band RF signal.

In tuning state (channel reception state) after stopping of the channel selecting operation, tuning circuit 17 tunes to the broadcasting signal frequency of the selected station. Therefore, after being amplified by FET15, the input RF signal from antenna 14 is subjected to AGC in first AGC transistor 16 in an ON state and applied to tuning circuit 17. Tuning circuit 17 applies the narrow band RF signal corresponding to the broadcasting frequency of the selected station through selection circuit 26 to first mixing circuit 27. First mixing circuit 27 mixes the narrow band RF signal with the oscillating signal from first local oscillating circuit 24 to generate a first IF signal of 10.7 Mhz. Consequently, a reproduced signal is obtained from the narrow band RF signal in the tuning state.

AGC signal generating circuit 35 receives the second wide band RF signal from tuning circuit 17 and the signal in the front stage of first mixing circuit 27. In the automatic channel selection state, AGC signal generating circuit 35 generates a wide band AGC signal in response to the wide band RF signal from second AGC transistor 19, which AGC signal is applied to the base of second AGC transistor 19.

In a tuning state, a wide band AGC signal is produced according to a second wideband RF signal from first AGC transistor 16 produced by small resistor 18. Thereby, a wide band AGC can at all times be done in accordance with a reception field strength.

While resistor 18 is small as 300 so that it generates a wide band RF signal of a small amplitude change, AGC signal generating circuit 35 includes an amplifying circuit in an input stage, thereby generating a precise wide band AGC signal in accordance with the signal of a small amplitude change.

As in the foregoing, during an automatic channel selection, RL parallel circuit 20 including large resistance 21 and provided on separate path from tuning circuit 17 generates a wide band RF signal, which RF signal having a large amplitudes change is transmitted to down stream circuitry, thereby carrying out a tracking error free channel selection.

When tuned after the automatic channel selection, RF tuning circuit 17 operates to generate a narrow band RF signal which is used for tuning, thereby preventing cross modulation interference and the like.

When tuned, a wide band AGC operation is carried out by generating a wide band RF signal by using small resistor 18. Therefore, a reception of an interference radio wave signal outside the band of tuning circuit 17 causes no deterioration in isolation of tuning circuit 17 but a small change in small resistor 18, resulting in no generation of beat interference due to the interference radio wave signal.

The automatic channel selection by PLL circuit 23 completes when the first IF signal level exceeds a predetermined reference value. In this case, the oscillating control signal from PLL circuit 23 continuously changes, and a case may occur in which precise channel selection state cannot be attained, whereby a reception state is attained at a frequency deviating from the channel frequency. The description will be made in the following of the arrangement for achieving a reception precisely tuned to a channel frequency.

Figure 5:
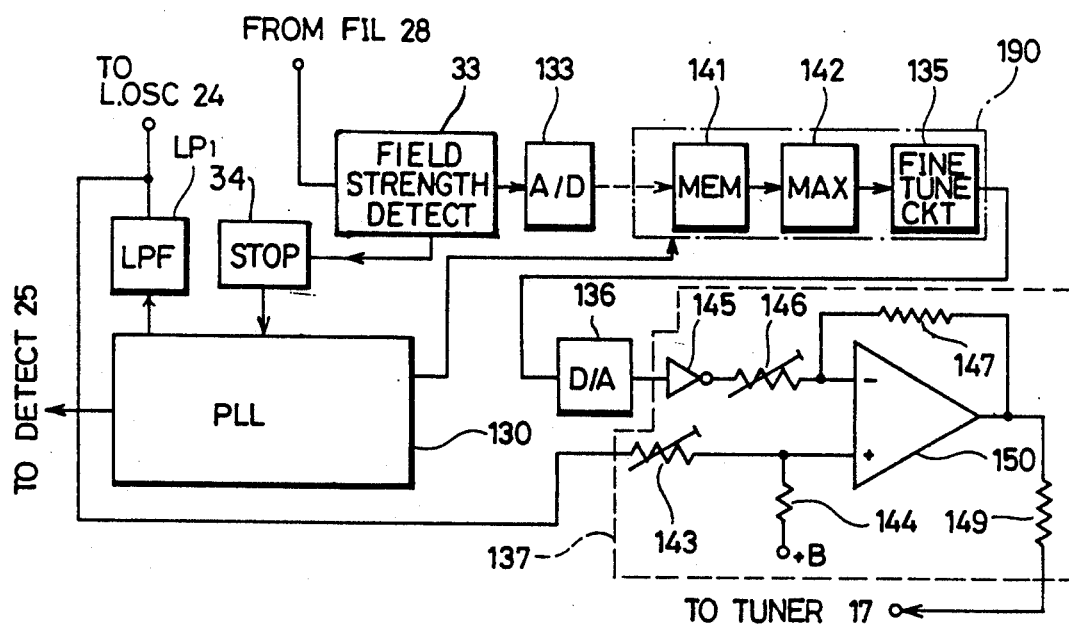
FIG. 5 shows an arrangement of a main part of a radio receiver according to another embodiment of the present invention.

FIG. 5 shows a circuit arrangement for fine tuning a tuning frequency of tuning circuit 17. In FIG. 5, the same reference numerals are allotted to the components corresponding to those of FIG. 4.

In FIG. 5, a fine tuning stage includes a fine tuning control circuit 190 for storing a field strength detection signal from field strength detecting circuit 33 in response to an automatic channel selection stop generated from a PLL circuit 130 to generate a fine tuning control signal (fine tuning signal), and an adder 137 for adding the fine tuning signal from fine tuning control circuit 190 and an oscillating frequency control signal generated from PLL circuit 130. The output signal of adder 137 is applied to tuning circuit 17.

Provided between field strength detecting circuit 33 and fine tuning control circuit 190 is an analogue/digital (A/D) converter 133 for converting an analogue field strength detection signal from field strength detecting circuit 33 to a digital signal. Provided between adder 137 and fine tuning control circuit 190 is a digital-analogue (D/A) converter 136 for converting a digital fine tuning signal to an analogue signal which is transmitted to one input of adder 137.

Fine tuning control circuit 190 comprises, for example, a microprocessor that includes a memory 141 for storing digital data from A/D converter 133, a maximum value detecting circuit 142 for detecting a maximum value of the data stored in memory 141 and a fine tuning circuit 135 for outputting a fine tuning signal corresponding to a maximum value detected by maximum value detecting circuit 142. Fine tuning circuit 135 sequentially outputs fine tuning signals of 6 bits (64 level), for example, to regularly output a fine signal tuning providing the maximum field strength among the 64 level signals.

Adder 137 includes an operational amplifier (operational amplifier) 150 having a positive input receiving an oscillating control signal from PLL circuit 130 through an adjusting resistor 143 and a negative input receiving an analogue fine tuning signal from D/A converter 136 through an invertor 150 and an adjusting resistor 146.

The adder 137 further includes a reference bias resistor 144 applying a reference voltage to the positive input of op amplifier 150 in response to a reference voltage +B and a feed back resistor 147 for feeding back the output op amplifier 150 to the negative input thereof. The output of D/A converter 136 is inverted by invertor 145 to be applied to the negative input of amplifier 150 which outputs a signal of the addition of a fine tuning signal and an oscillating control signal. The output of op amplifier 150 is applied to a variable capacitance diode VD of tuning circuit 17 through a resistor 149. The operation will be described in the following.

In an automatic channel selecting operation, when a field strength detection signal of field strength detecting circuit 33 attains a level equal to or above a predetermined value, stop circuit 34 generates a stop signal, thereby stopping the oscillation control signal of PLL circuit 130 from changing.

The channel selection stop information of PLL circuit 130 is transmitted to fine tuning control circuit 190, thereby starting a fine tuning operation.

The oscillation control signal applied to first local oscillating circuit 24 is applied to the positive input of op amplifier 150 through adjusting resistor 143. The output signal generated from adder 137 in response to the oscillation control signal carries out a coarse tuning of RF tuning circuit 17.

Fine tuning control circuit 190 sequentially generates fine tuning control signals at the start of the operation. The fine tuning control signal is a digital signal of, for example, 6 bits and capable of expressing 64 levels. The 6-bit digital fine tuning control signal is sequentially incremented by one step to be generated.

The digital control signal is converted to an analogue signal by D/A converter 136 and applied to the negative input of Op amplifier 150 through invertor 145 and adjusting resistor 146. Op amplifier 150 outputs a signal of an addition of the coarse tuning control signal from PLL circuit 130 and the fine tuning signal from D/A converter 136. The addition signal is applied to RF tuning circuit 17.

The tuning frequency of RF tuning circuit 17 changes in response to the output signal of adder 137. The narrow band RF signal from RF tuning circuit 17 is applied to first mixing circuit 27 through selection circuit 26 (see FIG. 4) to generate a first IF signal. The level of the first IF signal is detected by field strength detecting circuit 33. The detected signal is converted to a digital signal by A/D converter 133 and applied to fine tuning control circuit 190.

Fine tuning circuit 135 writes the output of D/A converter 133 into memory 141 in response to each digital fine tuning signal. As a result, the 64 address regions of memory 141 store data indicative of field strength for 64 fine tuning signals.

When the writing to memory 141 is finished for all the field strength data corresponding to the digital fine tuning signals, the output signal of fine tuning circuit 135 stops changing, and maximum value detecting circuit 142 starts operating. Maximum value detecting circuit 142 detects the data of the maximum value among the storage data in memory 141. This operation is directed to detecting a tuning frequency at which a maximum first IF signal (narrow band RF signal) level is obtained when the tuning frequency of RF tuning circuit 17 is changed.

Upon the detection of the maximum value by maximum value detecting circuit 142, fine tuning circuit 135 outputs a fine tuning signal corresponding to the maximum value in response to the output signal of maximum value detecting circuit 142.

As a result, adder 137 outputs such a tuning control signal as providing a maximum signal level and the tuning frequency of RF tuning circuit 17 is fixed to the frequency providing the maximum signal level. That is, the radio receiver enters a best reception state.

At an automatic channel selection, fine tuning control circuit 190 is initialized to wait for a channel selection stop. At this time, the initial output signal level of D/A converter 136 is set to an appropriate value such that the tuning frequency of RF tuning circuit 17 is outside the band at which a channel selecting operation is adversely affected.

Fine tuning control circuit 190 may comprise a microcomputer. With the microcomputer, appropriate programming of the operation of the microcomputer facilitates sequential output of 64 fine tuning signals from tuning circuit 135 and the writing of field strength data in 64 addresses of memory 141 each address corresponding to each of the 64 tuning signals.

There are various operation manners for a maximum value detection by maximum value detecting circuit 142 and the output of the tuning signal corresponding to the maximum value. The following manner can be employed.

The 64 addresses of memory 141 are made correspondent to the 64 fine tuning signals. Maximum value detecting circuit 142 reads the data stored in the first address N of memory 141 and the data stored in the address N+1 and compares them. Then, the larger data thereof is compared with the data stored in the address of N+2. This step will be sequentially repeated to designate an address M storing the maximum data.

Fine tuning circuit 135 is informed of the address M. Fine tuning circuit 135 selects a fine tuning signal corresponding to the address M and outputs the same.

As in the foregoing, after the channel selection is stopped, the tuning frequency of RF tuning circuit 17 is set based on the oscillation control signal of PLL circuit 130 as a coarse tuning signal and the fine tuning signal from the fine tuning control circuit, thereby achieving more precise tuning.

In a case where PLL circuit 130 is a digital PLL and having a function of outputting an oscillation control signal as a digital signal, this digital oscillation control signal can be used as a coarse tuning signal. At this time, an addition of the digital coarse tuning signal and the digital fine tuning signal in a digital manner increases a bit length of the digital signal indicative of the addition result. That is, the digital coarse tuning signal is set to be more significant bits (for example 6 bits) and the digital fine tuning signal is set to be less significant 6 bits. An analogue control signal should be applied to RF tuning circuit 17. Thus, a 12-bit digital signal should be converted to an analogue signal. In such a case, a bit length of the D/A converter is increased, and excellent linearity might not be obtained to prevent a desired tuning.

The above-described digital control signal of PLL circuit 130 may be D/A converted to an analogue signal which is added with an analogue fine tuning signal in an analogue manner. Also in this case, the digital control signal of PLL circuit 130 should cover all the reception band, and the range of the change is much greater than that of the tuning signal. Therefore, a D/A converter having a large bit length is required for utilizing a digital control signal of a PLL circuit as a coarse tuning signal, and D/A conversion having a desired linearity might not be achieved.

With such an arrangement as shown in FIG. 5 in which an analogue oscillation control signal is employed as a coarse tuning signal which is level-adjusted by adjusting resistor 143 and applied to op amplifier 150, the necessity of a D/A converter having a large bit length for a coarse tuning signal is eliminated. Provided is only a D/A converter having a small bit length for a coarse tuning signal, which achieves more precise tuning in an RF tuning circuit.

When the D/A converter has sufficient linearity even with an increased bit length, a digital control signal from PLL circuit 130 may be employed as a coarse tuning signal.

It is preferable that the tuning frequency of RF tuning circuit 17 is set at a high speed in order to reduce a time required for an automatic channel selection. We will describe in the following the arrangement for achieving tuning of the RF tuning circuit at a high speed.

Figure 6:
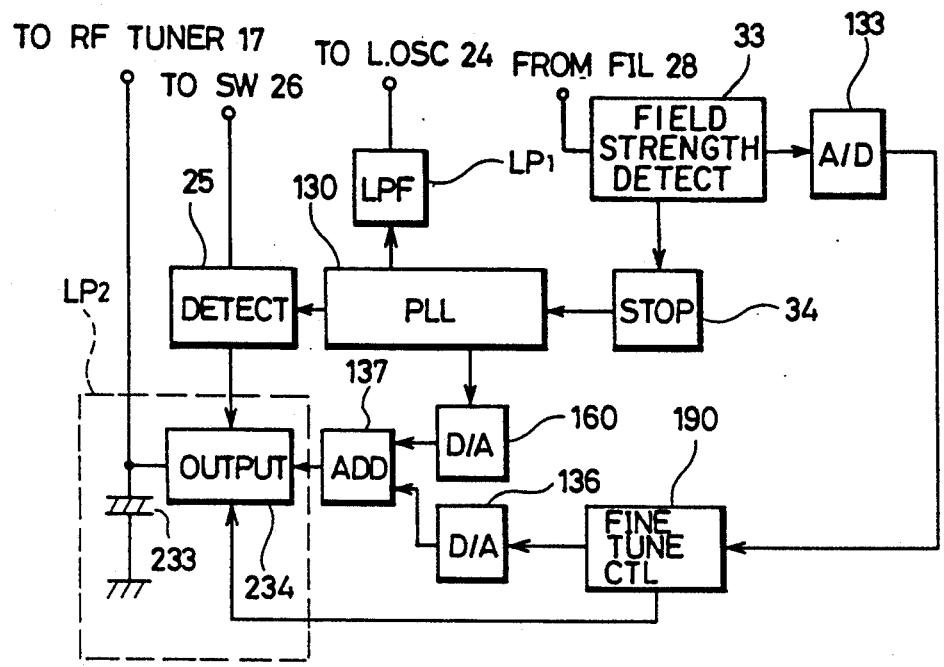
FIG. 6 shows an arrangement of a main part of a radio receiver according to still another embodiment of the present invention.

FIG. 6 shows the arrangement for improving a response speed of the RF tuning circuit. In FIG. 6, the same reference numerals (symbols) are allotted to the components corresponding to those shown in FIGS. 4 and 5. In FIG. 6, low pass filter LP2 includes a capacitor 233 and an output circuit 234 for charging/discharging capacitor 233 in response to the output of adder 137. Capacitor 233 having a function of improving a SN ratio is provided between a first potential (ground) and the control signal input of tuning circuit 17.

Output circuit 234 has an output supply current value set based on the control signal from detection circuit 25 and the control signal from fine tuning control circuit 190. More specifically, a first constant current I1 is selected at an automatic channel selection and at a fine tuning and a second constant current I2 smaller than the first constant current I1 is selected at a reception (after the completion of the fine tuning operation).

In FIG. 6, the digital control signal from PLL circuit 130 is converted to an analogue signal by D/A converter 160 and the converted signal is applied to adder 137. D/A converter 160 has a sufficient linearity. In this case, as shown in FIG. 5, the analogue control signal output from low pass filter LP1 may be applied to adder 137. The operation thereof will be described.

Automatic channel selection state detecting circuit 25 detects that PLL circuit 130 enters an automatic channel selection state.

Output circuit 234 has a first constant current I1 selected as an operation current in response to the automatic channel selection state detected by detection circuit 25, thereby charging or discharging capacitor 233 at a high speed. A charge potential of capacitor 233 is applied to a variable capacitance diode VD. As a result, the tuning frequency of RF tuning circuit 17 is set to be outside the reception band in order not to adversely affect the channel selecting operation using the wide band RF signal from the second AGC transistor (see FIG. 4). The initialization thereof is carried out by setting the output of D/A converter 160 under the control of PLL circuit 133.

Upon completion of the automatic channel selection state and the fixing of the oscillation control signal of PLL circuit 130, a fine tuning operation starts. During the fine tuning operation, PLL circuit 130 generates a digital control signal for setting a tuning frequency of RF tuning circuit 17, which signal is applied to D/A converter 160 to be converted to an analogue signal which is applied to adder 137.

Detection circuit 25 switches the control signal level in response to the stop of the automatic channel selecting operation. Since fine tuning control circuit 190 is activated in response to the stop of the automatic channel selection, a control signal from control circuit 190 is applied to output circuit 234 in response to the start of the fine tuning operation. Output circuit 234 operates using the first constant current I1 as an operation current in response to the start of the fine tuning operation. As a result, capacitor 233 is charged or discharged at a high speed in response to the coarse tuning signal output from adder 137 and the tuning frequency of RF tuning circuit 17 is set to the frequency selected at the automatic channel selection.

At a fine tuning, the output of adder 137 varies in response to a fine tuning signal from fine tuning control circuit 190. Capacitor 233 is charged or discharged at a high speed in response to the output signal level of adder 137, thereby fine-tuning the tuning frequency of RF tuning circuit 17 at a high speed.

Upon completion of the fine tuning operation and the fixing of the fine tuning signal level, the radio receiver enters a reception state. When the tuning frequency of RF tuning circuit 17 is fixed to be in the reception state, the operation current I2 of output circuit 234 is switched to the second constant current I2 in response to the control signal from fine tuning control circuit 190. In the reception state, capacitor 233 is charged/discharged using the second constant current I2 as an operation current.

With the above-described arrangement, during the automatic channel selection and the fine tuning, capacitor 233 is charged/discharged at a high speed and the time constant of low pass filter LP2 is reduced to improve the response speed. During the reception, capacitor 233 is charged and discharged at a relatively slow speed and the time constant of low pass filter LP2 is increased to improve SN ratio.

Figure 7:
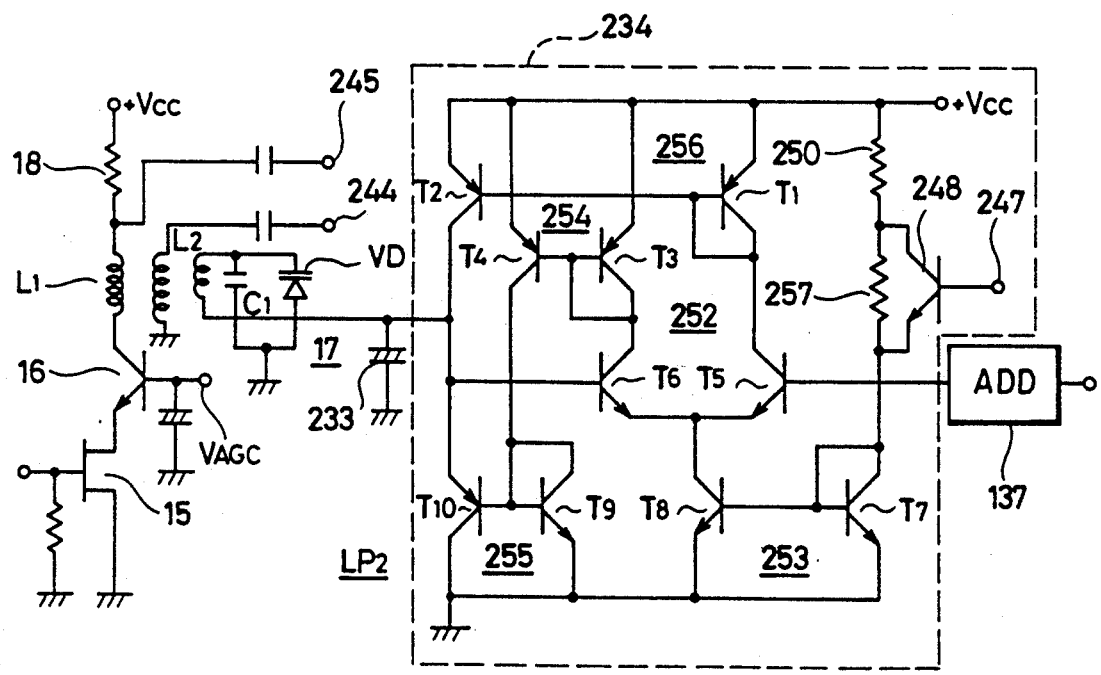
FIG. 7 shows one example of the specific arrangement of the output circuit shown in FIG. 6.

FIG. 7 shows the specific arrangement of output circuit 234. With reference to FIG. 7, output circuit 234 includes an npn bipolar transistor 248 and resistors 250 and 257 for setting an operation current. Resistor 250 has one end connected to an operation power supply +Vcc. Resistor 257 is serially connected to resistor 250. Transistor 248 has a collector connected to one end of resistor 257, an emitter connected to the other end of resistor 257 and the base connected to a control signal input end 247. Control signal input node 247 receives a logical sum signal of a control signal from detection circuit 25 and a control signal from fine tuning control circuit 190.

Output circuit 234 further includes current mirror circuits 253, 254, 255 and 256 and an emitter coupled circuit 252. Current mirror circuit 253 includes an npn bipolar transistor T7 having a collector and a base connected to each other and an npn bipolar transistor T8 having a collector connected to the common emitter output of emitter coupled circuit 252.

Current mirror circuit 254 includes an npn bipolar transistor T4 having a base and a collector connected to each other. Current mirror circuit 255 includes an npn bipolar transistor T9 having a base and a collector connected to the collector of transistor T4 and an npn bipolar transistor T10 having a collector connected to capacitor 233.

Current mirror circuit 256 includes a pnp bipolar transistor T1 having a collector and a base connected to each other and a pnp bipolar transistor T2 having a collector connected to capacitor 233 and the collector of transistor T10.

Emitter coupled circuit 252 includes an npn bipolar transistor T5 having a collector connected to the base and the collector of transistor T1 and a base connected to the output of adder 132, and an npn bipolar transistor T6 having a collector connected to the base and the collector of transistor T3 and a base connected to capacitor 233.

In a current mirror circuit, the same amount of current as that flowing through a transistor having a base and a collector connected to each other flows in its paired transistor. In the emitter coupled circuit, a transistor receiving a higher voltage at its base is turned on and the other transistor is turned off. The operation thereof will be described.

During an automatic channel selection and a fine tuning, a "H" (logical high) signal is applied to control signal input terminal 247. Transistor 248 is turned on to short circuit resistor 257. A large first constant current I1 determined by resistor 250 flows through transistor T7. The same first constant current I1 flows through transistor T8.

The first constant current I1 flows through emitter coupled circuit 252. When the output voltage of adder 137 is higher than the charge potential of capacitor 233, transistor T5 is turned on to charge the capacitor 233.

In the inverse case, transistor T6 is turned on to discharge the capacitor 233.

As in the foregoing, during the automatic channel selection and the fine tuning, capacitor 233 is charged/discharged using the first constant current I1 as an operation current (reference current), thereby reducing the time constant of low pass filter LP2 to improve response.

At the reception, transistor 248 is turned off and the second current I2 determined by resistors 250 and 257 flows through transistor T7. The second constant current I2 is smaller than the first constant current I1. The above-described operation is carried out using the second constant current I2 as a reference current. In this case, charging/discharging of capacitor 233 is carried out slower than that by using the first constant current I1, thereby increasing the time constant of low pass filter LP2 to improve SN ratio.

The above-described arrangement achieves a switching of a time constant of a low pass filter provided at a control path for controlling a tuning frequency of RF tuning circuit 17.

As in the foregoing, according to the present invention, an automatic channel selection can be performed by using a wide band RF signal to allow a tracking error free channel selection.

In addition, in a tuned state (reception state), tuning is carried out by using a narrow band RF signal to prevent cross modulation interference.

Since no wide band RF signal is generated in a wide band RF signal generating path for use in an automatic channel selection, which path is disconnected at a fine tuning and a reception, even if an interference short wave signal outside the band of the Rf tuning circuit is received, no beat interference due to the leakage of the signal is generated.

The tuning operation includes a coarse tuning operation and a fine tuning operation, thereby achieving a precise tuning.

By switching a time constant of a low pass filter provided at a control path for setting a tuning frequency of an RF tuning circuit, a time required for changing from a channel selection to a reception state is reduced to improve SN ratio at the reception.

Furthermore, a tuning frequency control signal generated by adding an analogue oscillation control signal from a PLL circuit and a D/A converted fine tuning signal reduces a bit length of a D/A converter, thereby achieving D/A conversion with excellent linearity and a precise tuning.

As in the foregoing, the present invention provides an AM radio receiver of excellent performance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An RF amplifying circuit for a receiver for amplifying an incoming radio frequency signal from an antenna, comprising:
    means for amplifying the incoming radio frequency signal,
    first gain controlling means coupled to the output of said amplifying means for controlling the level of an output signal from said amplifying means,
    second gain controlling means coupled to the output of said amplifying means for controlling the level of an output signal from said amplifying means,
    tuning means coupled to the output of said first gain controlling means for extracting a narrow band RF signal including a desired frequency region from said incoming radio frequency signal, first means coupled to the output of said second gain controlling means for generating a wide band RF signal from said incoming radio frequency signal, control means responsive to a channel selecting instruction for setting said first and second gain controlling means in opposite operational states, and selection means responsive to the output of said control means for selectively passing one of said narrow band RF signal and said wide band RF signal to down-stream circuitry, said selection means passing said wide band RF signal during a channel selection and passing said narrow band RF signal after the completion of the channel selection.

2. The RF amplifying circuit according to claim 1, further comprising:

a load resistance connected between said tuning means and a power supply (+Vcc) for extracting a wide band RF signal, means responsive to the signal produced by said load resistance for controlling the gain of said first gain controlling means.

3. The RF amplifying circuit according to claim 2, wherein said first means includes a resistance element, the resistance value of said load resistance being smaller than that of said resistance element.

4. The RF amplifying circuit according to claim 1, wherein said control means further comprises:

tuning frequency controlling means responsive to a channel selecting instruction for generating a first control signal for changing a tuning frequency, means (33) detecting the strength of the wideband RF signal under reception, means responsive to the output signal of said strength detecting means for determining whether the channel selection is completed or not and fixing said first control signal, and fine tuning means responsive to the detection of the completion of the channel selection from said determining means for generating a fine tuning control signal to adjust the tuning frequency of said tuning means.

5. The RF amplifying circuit according to claim 4, wherein said fine tuning means including means for generating a fine tuning control signal having its level variable to change the tuning frequency at said tuning means as set by said determining means, maximum value detecting means responsive to the generation of said variable fine tuning control signal for monitoring the output of said strength detecting means to detect the maximum value, and means for discriminating the control signal providing the maximum value detected by said maximum value detecting means from said variable fine tuning control signal to generate the discriminated fine tuning control signal as said fine tuning signal.

6. The RF amplifying circuit according to claim 1, wherein said control means includes means responsive to a channel selecting instruction for setting the tuning frequency of said tuning means to a frequency outside the band including at least the frequency region of said wide band RF signal during a period when said first gain controlling means is turned off.

7. The RF amplifying circuit according to claim 1, further comprising:

means for generating a tuning frequency control signal for setting the tuning frequency of said tuning means, said tuning frequency control signal generating means including:

means for generating a defining signal for defining a tuning frequency, defining signal controlling means responsive to said channel selecting instruction for varying said defining signal and responsive to said detection of the completion of the channel selection for fixing said defining signal, means responsive to said detection of the completion of the channel selection for generating a first tuning signal corresponding to the fixed defining signal, means activated in response to said detection of the completion of the channel selection for generating a fine tuning signal for fine tuning said first tuning signal, means for adding said first tuning signal and said fine tuning signal, and means for filtering the output of said adding means to transmit the filtered output as a tuning frequency control signal to said tuning means, said filtering means having at least two time constants, said fine tuning signal generating means including:

means responsive to the output signal strength of said selective passing means for identifying said fine tuning signal, and switching means (248) responsive to an operation state of said fine tuning signal identifying means for switching the time constants of said filtering means.

8. The RF amplifying circuit according to claim 7, wherein said fine tuning signal identifying means is operable in a fine tuning mode wherein an optimum fine tuning signal is obtained and in a reception mode wherein the optimum fine tuning signal is continuously output, and said switching means comprises means for setting the time constant of said filtering means to a first time constant in said reception mode and setting the time constant of said filtering means to a second time constant smaller than said first time constant in said fine tuning mode.

9. The RF amplifying circuit according to claim 7, wherein said filtering means comprises:

capacitor means for setting a tuning frequency of said tuning means in response to a charge potential thereof, and charging/discharging means for charging/discharging said capacitor means with a constant current in response to the output of said adding means, and wherein said fine tuning signal determining means is operable in a fine tuning mode wherein an optimum fine tuning signal is obtained and in a reception mode wherein the obtained optimum fine tuning signal is continuously applied to said adding means, and said switching means includes means j for setting the charging/discharging current of said charging/discharging means to a second constant current in said reception mode and setting the charging/discharging current of sid charging/discharging means to a first constant current larger than said second constant current in said fine tuning mode.

10. The RF amplifying circuit according to claim 1, wherein said control means further comprises:

means responsive to the level of said wide band RF signal at said downstream circuitry to switch the operational state of said first and second gain controlling means and said selection means such that said first gain controlling means is ON and said second gain controlling means is OFF and said selection means passes the narrow band RF signal to said downstream circuitry.

11. A radio receiver for reproducing a radio signal of a desired channel from an incoming radio frequency signal from an antenna, comprising:

RF tuning means for generating a narrow band RF signal having a band tuned to a frequency of a desired channel from said incoming radio signal, said RF tuning means including a control input and being responsive to a control signal applied to said control input for setting a frequency of said narrow band RF signal, means for generating a wide band RF signal from said incoming radio frequency signal, said wide band RF signal having a band at least covering all the bands of the narrow band RF signal which said RF tuning means can generate, first channel selecting means responsive to a channel selecting instruction for carrying out a channel section by utilizing said wide band RF signal, and second channel selecting means responsive to a completion of the channel selecting operation of said first channel selecting means for establishing the channel frequency selected by said first channel selecting means in said RF tuning means and for adjusting said established channel frequency by utilizing the narrow band RF signal from said RF tuning means, said second channel selecting means operable in a fine tuning mode wherein said established channel frequency is fine-tuned and in a reception mode wherein the tuning frequency tuned in said fine tuning mode is continuously kept, and including means for generating a tuning frequency control signal for controlling the frequency of the narrow band RF signal from said RF tuning means, filtering means for filtering said tuning frequency control signal and transmitting the filtered signal to said control input of said RF tuning means, said filtering means having at least a first time constant and a second time constant larger than said first time constant, and time constant setting means for setting said time constant of said filtering means to either said first or second time constant in accordance with the operation mode of said second channel selecting means.

12. The radio receiver according to claim 11, wherein said time constant setting means includes means for setting said time constant of said filtering means to said first time constant and to said second time constant in said fine tuning mode and in said reception mode, respectively.

13. The radio receiver according to claim 11, wherein said filtering means comprises:

capacitor means having one electrode coupled to said control input of said RF tuning means and the other electrode coupled to a reference potential, constant current supplying means capable of supplying at least a first constant current and a second constant current smaller than said first constant current, charging/discharging means having the constant current supplied from said constant current supplying means and coupled to said one electrode of said capacitor means for charging/discharging said capacitor means in response to said tuning frequency control signal from said second channel selecting means, said constant current supplying means including means responsive to said fine tuning mode for supplying said first constant current and means responsive to said reception mode for supplying said second constant current.

* * * * *